(12) United States Patent
Kim et al.

(10) Patent No.: US 11,430,679 B2
(45) Date of Patent: Aug. 30, 2022

(54) SEMICONDUCTOR MANUFACTURING APPARATUS

(71) Applicant: SAMSUNG ELECTRONICS CO., LTD., Suwon-si (KR)

(72) Inventors: Kwangnam Kim, Suwon-si (KR); Nohsung Kwak, Suwon-si (KR); Sungyeon Kim, Jeongeup-si (KR); Hyungjun Kim, Suwon-Si (KR); Haejoong Park, Yongin-Si (KR); Jongwoo Sun, Hwaseong-si (KR); Sangrok Oh, Yongin-si (KR); Ilyoung Han, Uiwang-si (KR); Jungpyo Hong, Gwangmyeong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 130 days.

(21) Appl. No.: 16/821,415

(22) Filed: Mar. 17, 2020

(65) Prior Publication Data
US 2021/0035830 A1 Feb. 4, 2021

(30) Foreign Application Priority Data
Jul. 30, 2019 (KR) .................. 10-2019-0092658

(51) Int. Cl.
*H01L 21/67* (2006.01)
*H01L 21/687* (2006.01)
(Continued)

(52) U.S. Cl.
CPC .. *H01L 21/67201* (2013.01); *H01L 21/67017* (2013.01); *H01L 21/67126* (2013.01);
(Continued)

(58) Field of Classification Search
CPC ......... H01L 21/67201; H01L 21/67017; H01L 21/67126
See application file for complete search history.

(56) References Cited

U.S. PATENT DOCUMENTS 6,168,672 B1 1/2001 Nguyen
6,234,107 B1 5/2001 Tanaka
(Continued)

FOREIGN PATENT DOCUMENTS

JP H06333913 A 12/1994
JP H10256352 A 9/1998
(Continued)

*Primary Examiner* — Saul Rodriguez
*Assistant Examiner* — Willie Berry, Jr.
(74) *Attorney, Agent, or Firm* — Lee IP Law, P.C.

(57) ABSTRACT

A semiconductor manufacturing apparatus including at least one load module including a load port on which a substrate container is located, a plurality of substrates being mountable on the substrate container; at least one loadlock module including a loadlock chamber directly connected to the substrate container, the loadlock chamber interchangeably having atmospheric pressure and vacuum pressure, a first transfer robot within the loadlock chamber, and a substrate stage within the loadlock chamber, the plurality of substrates being mountable on the substrate stage; a transfer module including a transfer chamber connected to the loadlock chamber, a second transfer robot within the transfer chamber, and a substrate aligner within the transfer chamber; and at least one process module including at least one process chamber connected to the transfer module.

18 Claims, 12 Drawing Sheets

(51) Int. Cl.
*H01L 21/677* (2006.01)
*H01L 21/673* (2006.01)

(52) U.S. Cl.
CPC .. *H01L 21/67161* (2013.01); *H01L 21/67196* (2013.01); *H01L 21/67379* (2013.01); *H01L 21/67389* (2013.01); *H01L 21/67772* (2013.01); *H01L 21/68707* (2013.01)

(56) References Cited

U.S. PATENT DOCUMENTS

| | | | |
|---|---|---|---|
| 6,338,626 | B1 | 1/2002 | Saeki |
| 8,562,275 | B2 | 10/2013 | Hiroki |
| 9,159,600 | B2 * | 10/2015 | Mizokawa ........ H01L 21/67739 |
| 9,543,180 | B2 | 1/2017 | Kamiya |
| 10,431,481 | B2 | 10/2019 | Wakabayashi |
| 2008/0305632 | A1 * | 12/2008 | Nishimura .......... H01L 21/6719 |
| | | | 438/680 |
| 2016/0027673 | A1 * | 1/2016 | Wang .................... H01L 21/324 |
| | | | 156/345.24 |

FOREIGN PATENT DOCUMENTS

| | | |
|---|---|---|
| JP | 4264196 B2 | 5/2009 |
| JP | 2017028158 A | 2/2017 |
| JP | 2018190939 A | 11/2018 |
| KR | 10-2002-0067960 | 8/2002 |
| KR | 10-2005-0036186 | 4/2005 |
| KR | 10-2006-0086603 | 8/2006 |
| KR | 10-0717990 | 5/2007 |
| KR | 10-2009-0002709 | 1/2009 |

\* cited by examiner

SEMICONDUCTOR MANUFACTURING APPARATUS

CROSS-REFERENCE TO RELATED APPLICATION

Korean Patent Application No. 10-2019-0092658, filed on Jul. 30, 2019, in the Korean Intellectual Property Office, and entitled: "Semiconductor Manufacturing Apparatus," is incorporated by reference herein in its entirety.

BACKGROUND

1. Field

Embodiments relate to a semiconductor manufacturing apparatus.

2. Description of the Related Art

Many semiconductor devices may be produced by reducing the space, namely, the footprint, occupied by a single semiconductor manufacturing apparatus in a semiconductor manufacturing factory, thereby lowering production costs. Furthermore, when a semiconductor device is manufactured by a semiconductor manufacturing apparatus, contamination of substrates, e.g., wafers, should be reduced to increase a process yield, thereby lowering production costs of semiconductor devices.

SUMMARY

The embodiments may be realized by providing a semiconductor manufacturing apparatus including at least one load module including a load port on which a substrate container is located, a plurality of substrates being mountable on the substrate container; at least one loadlock module including a loadlock chamber directly connected to the substrate container, the loadlock chamber interchangeably having atmospheric pressure and vacuum pressure, a first transfer robot within the loadlock chamber, and a substrate stage within the loadlock chamber, the plurality of substrates being mountable on the substrate stage; a transfer module including a transfer chamber connected to the loadlock chamber, a second transfer robot within the transfer chamber, and a substrate aligner within the transfer chamber; and at least one process module including at least one process chamber connected to the transfer module.

The embodiments may be realized by providing a semiconductor manufacturing apparatus including a load module including a load port on which a substrate container is located, a plurality of substrates being mountable on the substrate container; an isolation module including an isolation chamber on one side of the load module and directly connected to the substrate container; a loadlock module including a loadlock chamber connected to the isolation chamber, a first transfer robot within the loadlock chamber, and a substrate stage within the loadlock chamber, the plurality of substrates being mountable on the substrate stage; a transfer module including a transfer chamber connected to the loadlock chamber, and a second transfer robot within the transfer chamber; and a process module including a process chamber connected to the transfer module.

The embodiments may be realized by providing a semiconductor manufacturing apparatus a load module including a load port on which a substrate container is seated, the substrate container having a door on one side and being transferrable according to a substrate container transfer system, the load module being connected to a purge gas supply for supplying a purge gas into the substrate container; an isolation module including an isolation chamber on one side of the load module, the isolation chamber including a substrate inflow and outflow hole facing a door of the substrate container, a substrate inflow and outflow door on side opposite to a side on which the substrate inflow and outflow hole is provided, and a door controller within the isolation chamber, the door controller being configured to open or close the door of the substrate container; a loadlock module including a loadlock chamber connected to the isolation chamber, a first transfer robot within the loadlock chamber, and a substrate stage within the loadlock chamber, a plurality of substrates being mountable on the substrate stage; a transfer module including a transfer chamber connected to the loadlock chamber, and a second transfer robot within the transfer chamber; and a process module including a process chamber connected to the transfer module.

BRIEF DESCRIPTION OF THE DRAWINGS

Features will be apparent to those of skill in the art by describing in detail exemplary embodiments with reference to the attached drawings in which.

DETAILED DESCRIPTION

A semiconductor device may be manufactured by depositing several materials on a substrate to have a shape of a thin film and then patterning the thin film. The substrate may be, e.g., a wafer. To manufacture a semiconductor device, several steps of manufacturing processes, such as deposition, etching, cleaning, and drying, may be performed. In each of the manufacturing processes, a substrate may be mounted and processed in a process chamber that provides optimal conditions.

To achieve miniaturization, highly integration, and production improvement of semiconductor devices, a manufacturing process may be highly precise and highly complicated, and a substrate may have a large diameter. A semiconductor device manufacturing apparatus may have a multi-chamber structure in which a plurality of chambers are used to process manufacturing processes in batches. When semiconductor manufacturing apparatuses according to embodiments include multiple chambers, the semiconductor manufacturing apparatuses may be used in any of the manufacturing processes, such as deposition, etching, cleaning, and drying.

Figure 1:
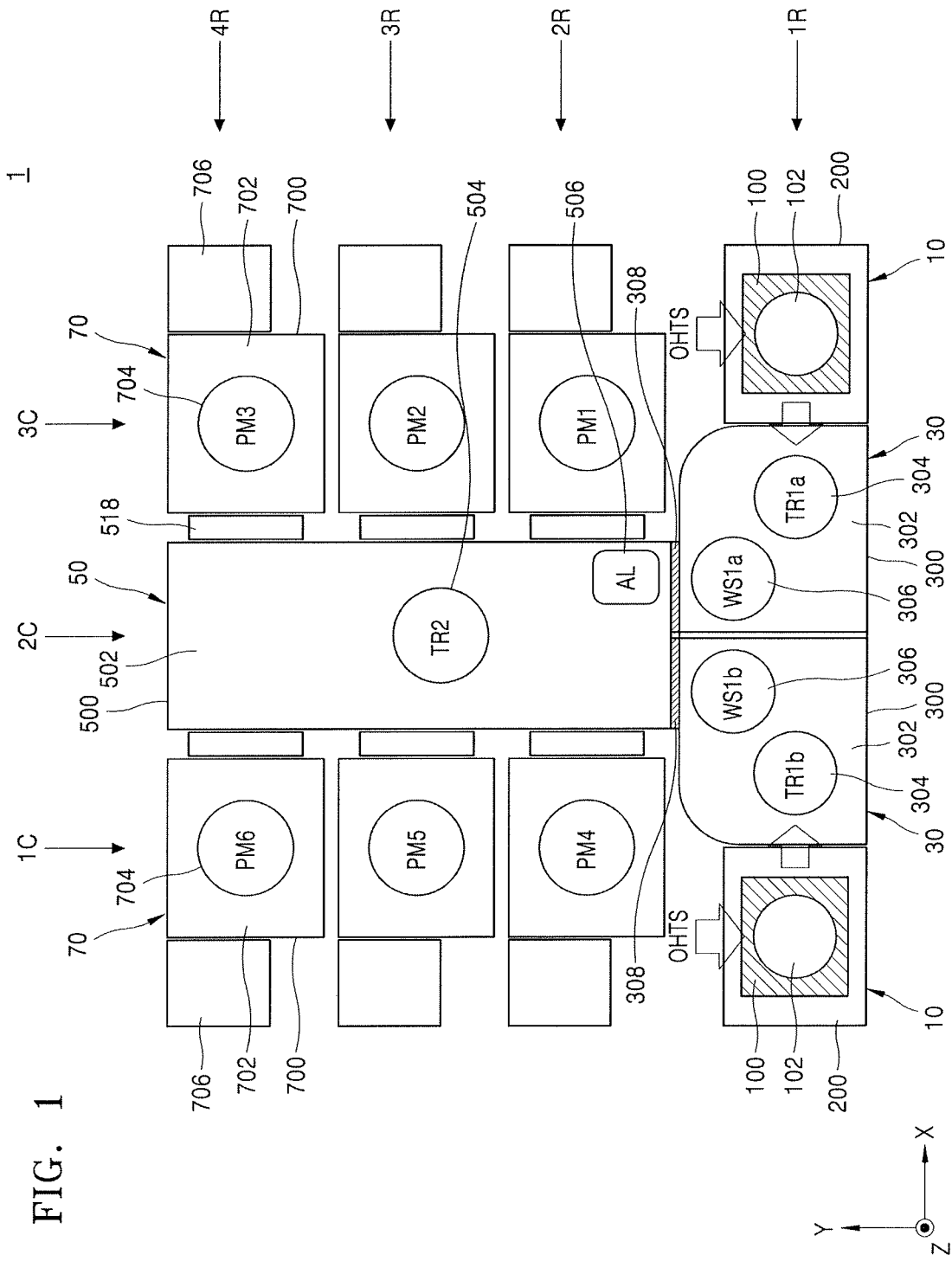
FIG. 1 illustrates a schematic diagram of a semiconductor manufacturing apparatus according to an embodiment.

FIG. 1 illustrates a schematic layout diagram of a semiconductor manufacturing apparatus 1 according to an embodiment.

For example, FIG. 1 illustrates a platform of the semiconductor manufacturing apparatus 1. The semiconductor manufacturing apparatus 1 of FIG. 1 may be an inline platform structure in which a plurality of process chambers 700 are serially arranged on both sides of a transfer chamber 500.

The semiconductor manufacturing apparatus 1 may include a load module 10, a loadlock module 30, a transfer module 50, and a process module 70. The semiconductor manufacturing apparatus 1 may be a substrate processing apparatus (or a substrate processing system) of a multi-chamber type including the load module 10, the transfer module 50, and the loadlock module 30 and the process module 70 provided around the transfer module 50.

Hereinafter, a module is used to describe inclusion of a plurality of components or component parts. The load module 10, the loadlock module 30, the transfer module 50, and the process module 70 may be named as a load unit, a loadlock unit, a transfer unit, and a process unit, respectively.

The load module 10 and the loadlock module 30 may be located or aligned on a same row, e.g., a first row 1R, in a two-dimensional (2D) manner, within the semiconductor manufacturing apparatus or a semiconductor manufacturing factory. The transfer module 50 and the process module 70 may be located or aligned on or cross rows, e.g., second, third, and fourth rows 2R, 3R, and 4R, different from (e.g., spaced apart in a Y direction from) the row on which the load module 10 and the loadlock module 30 are located in a 2D manner, within the semiconductor manufacturing apparatus or factory.

The load module 10 may include a plurality of, e.g., two, load modules. The loadlock module 30 may include a plurality of, e.g., two, loadlock modules. The process module 70 may include row process modules and column process modules aligned in a row direction (X direction) and a column direction (Y direction), respectively, in a 2D manner within the semiconductor manufacturing apparatus or factory.

The row process modules may be the process modules 70 located, grouped, or aligned on the second row 2R, the third row 3R, and the fourth row 4R. The column process modules may be the process modules 70 located, grouped, or aligned on a first column 1C and a third column 3C. The transfer module 50 may be between the column process modules, e.g., aligned on a second column 2C, in a 2D manner within the semiconductor manufacturing apparatus or factory.

The load module 10 may include a load port 200 on which a substrate container 100 (in which a plurality of substrates 102 may be mountable thereon) is located. In an implementation, as illustrated in FIG. 1, two load modules 10 may be included.

The substrate container 100 may be referred to as, e.g., a substrate carrier or a wafer carrier. The substrate container 100 may accommodate the substrates 102, e.g., wafers, and may be implemented using an enclosed front open unified pod (FOUP) to prevent a substrate 102 from being contaminated by foreign materials or chemical contamination in the air while the substrate 102 is being transferred. The substrate container 100 may include a door 140 (see FIG. 6) mounted detachably on a body 120 (see FIG. 6) of the substrate container 100 to open or close an opening via which the substrate 102 may be carried into or out of the substrate container 100.

The substrate container 100 may be transferred to the load port 200 by using a substrate container transfer system (OHTS) as indicated by an arrow. The substrate container transfer system (OHTS) may be an Overhead Hoist Transport System (OHTS) that transports the substrate container 100 at the top of the semiconductor manufacturing apparatus 1 and over the head of a worker within the semiconductor manufacturing factory. The substrate container transfer system (OHTS) may be a system that transports the substrate container 100 to the semiconductor manufacturing apparatus 1 along a rail provided on the ceiling of the semiconductor manufacturing factory without intervention of workers.

The substrate container 100 may stand by in or on the load port 200 during a semiconductor manufacturing process with respect to the substrate 102. The substrate container 100 may be transferred from the load port 200 after a substrate 102 (for which the semiconductor manufacturing process has been completed) is mounted on the substrate container 100.

The substrate container 100 may be supplied with a purge gas, e.g., nitrogen gas, to help prevent contamination of a substrate 102 before a semiconductor manufacturing process, or a gas emitted from the substrate 102 for which the semiconductor manufacturing process has been completed may be removed from the substrate container 100 to help prevent contamination of the substrate 102 after the semiconductor manufacturing process.

The loadlock module 30 may be directly connected to one side of the load module 10 where the substrate container 100 is located. The load module 10 where the substrate container 100 is located may be tightly connected to the loadlock module 30. Due to the direct connection of the loadlock module 30 to one side of the load module 10, the semiconductor manufacturing apparatus 1 may greatly reduce a space occupied by the semiconductor manufacturing apparatus 1 within the semiconductor manufacturing factory, e.g., a footprint.

In addition, the semiconductor manufacturing apparatus 1 according to an embodiment may not include an equipment front end module (EFEM) keeping high cleanliness, thereby greatly reducing the space occupied by the semiconductor manufacturing apparatus 1 within the semiconductor manufacturing factory, e.g., the footprint.

The loadlock module 30 may include a loadlock chamber 300 having an inner space 302 that accommodates a first transfer robot 304 (TR1a or TR1b) and a substrate stage 306 (WS1a or WS1b). In an implementation, as illustrated in FIG. 1, two loadlock modules 30 may be included in the apparatus. The loadlock chamber 300 may be blocked or isolated from ambient air (e.g., of the semiconductor manufacturing factory). The loadlock chamber 300 may be supplied with a purge gas to help prevent contamination of the substrates 102.

The substrates 102 mounted on the substrate container 100 may be loaded on the substrate stage 306 of the loadlock chamber 300 by using the first transfer robot 304 as indicated by arrows. The substrates 102 mounted on the substrate container 100 may be transferred to the loadlock chamber 300, and the substrate stage 306 may be a component for the semiconductor manufacturing apparatus 1. In addition, the substrate 102 for which a manufacturing process has been completed may be transferred from the process chamber 700 to the loadlock chamber 300, and the substrate stage 306 may be a component for the semiconductor manufacturing apparatus 1.

The substrate stage 306 may accommodate the substrates 102 not yet subjected to the semiconductor manufacturing process or the substrates 102 for which the semiconductor manufacturing process has been completed. On the substrate stage 306, the substrates 102 not yet subjected to the semiconductor manufacturing process or the substrates 102 for which the semiconductor manufacturing process has been completed may stand by.

In an implementation, the first transfer robot 304 may include a plurality of robot hands capable of transferring the plurality of substrates 102. In an implementation, the first transfer robot 304 may include a single robot hand capable of transferring a single substrate 102.

The loadlock module 30 may control an internal pressure of the loadlock chamber 300. The loadlock module 30 may control the internal pressure of the loadlock chamber 300 between, e.g., atmospheric pressure and vacuum pressure. The loadlock module 30 may control the internal pressure of the loadlock chamber 300 to be atmospheric pressure to make balance with an external pressure, when a substrate 102 is transferred from the substrate container 100 on the load port 200 to the loadlock chamber 300.

For example, the semiconductor manufacturing apparatus 1 may prevent ambient air of the semiconductor manufacturing factory from flowing into the inner space 302 of the loadlock chamber 300. When the substrates 102 accommodated in the loadlock chamber 300 are transferred to the transfer chamber 500, the loadlock module 30 may control the internal pressure of the loadlock chamber 300 to the vacuum pressure.

An inflow and outflow door 308 for restricting entry and exit of substrates by opening or closing a passage may be between the loadlock module 30 and the transfer module 50, and the inflow and outflow door 308 may connect or separate the inside of the loadlock chamber 300 to or from the inside of the transfer chamber 500 of the transfer module 50. The loadlock module 30 may control the internal pressure of the loadlock chamber 300 to the vacuum pressure, before the inflow and outflow door 308 is opened.

The internal pressure of the loadlock chamber 300 may be controlled to be a pressure close to the vacuum pressure of the transfer chamber 500 of the transfer module 50. The internal pressure of the loadlock chamber 300 may be controlled to be close to the internal pressure of the transfer chamber 500, and a pressure state of the transfer chamber 500 may be prevented from changing according to opening of the inflow and outflow door 308.

The transfer module 50 may include a transfer chamber 500 having a vacuum atmosphere, and a second transfer robot 504 (TR2) within the transfer chamber 500 to transfer the substrates 102. In an implementation, as illustrated in FIG. 1, a single second transfer robot 504 may be provided, or a single transfer robot may be provided in a plurality of, e.g., two, process chambers 700. When the inflow and outflow door 308 between the transfer module 50 and the loadlock module 30 has been opened, the second transfer robot 504 may carry a substrate 102 out of the substrate stage 306 or may carry a substrate 102 into the substrate stage 306.

A substrate aligner 506 may be in the transfer chamber 500. The substrate aligner 506 may align a location or direction of a substrate 102 before the substrate 102 is transferred to the process chamber 700.

The area or space of the transfer chamber 500 may be greater than that of the loadlock chamber 300, and the substrate aligner 506 may be provided in the transfer chamber 500. In an implementation, a substrate 102 for which a manufacturing process has been completed within the process chamber 700 may be transferred to the substrate stage 306 of the loadlock chamber 300 without passing through the substrate aligner 506.

The transfer module 50 may transfer the substrates 102 between the substrate stage 306 of the loadlock chamber 300 and the process module 70. The transfer module 50 may be a vacuum transfer module that transfers the substrates 102 at a vacuum atmosphere.

The process module 70 may perform a semiconductor manufacturing process with respect to a substrate. An inflow and outflow door 518 restricting or controlling entry and exit of a substrate by opening or closing a passage may be provided between the process module 70 and the transfer module 50. The process module 70 may include a plurality of process chambers 700 (PM1-PM6) arranged on one sidewall of the transfer module 50. In the process chamber 700, a semiconductor manufacturing process may be performed under a vacuum pressure.

The process module 70 may include inner spaces 702 of the process chambers 700, stations 704 where substrates 102 are located, and service spaces 706 around the process chambers 700. The load module 10 may face or be aligned with the service spaces 706 of the process chambers 700 in the column direction (Y direction), thereby reducing a footprint of the semiconductor manufacturing apparatus 1. For example, an outer edge of the load module 10 may be aligned with an outer edge of the service spaces 706 in the Y direction). The process module 70 may be, e.g., etch equipment (e.g., dry etch equipment or apparatus)), deposition equipment (e.g., chemical vapor deposition equipment), a thermal furnace, developing equipment, or cleaning equipment.

The semiconductor manufacturing apparatus 1 may include a controller for controlling operations of the load module 10, the loadlock module 30, the transfer module 50, and the process module 70. In an implementation, the controller may be implemented using a general personal computer (PC), a workstation, or a super-computer.

The above-described semiconductor manufacturing apparatus 1 according to an embodiment may greatly reduce a footprint thereof by connecting the load module 10, in which the substrate container 100 is located, directly to the loadlock module 30.

The semiconductor manufacturing apparatus 1 according to an embodiment may greatly reduce a footprint thereof by placing the load module 10 at a location facing or aligned with the service spaces 706 of the process module 70.

In addition, the semiconductor manufacturing apparatus 1 according to an embodiment may help reduce contamination of the substrates 102 by supplying a purge gas to the load module 10 where the substrate container 100 is located.

Figure 2:
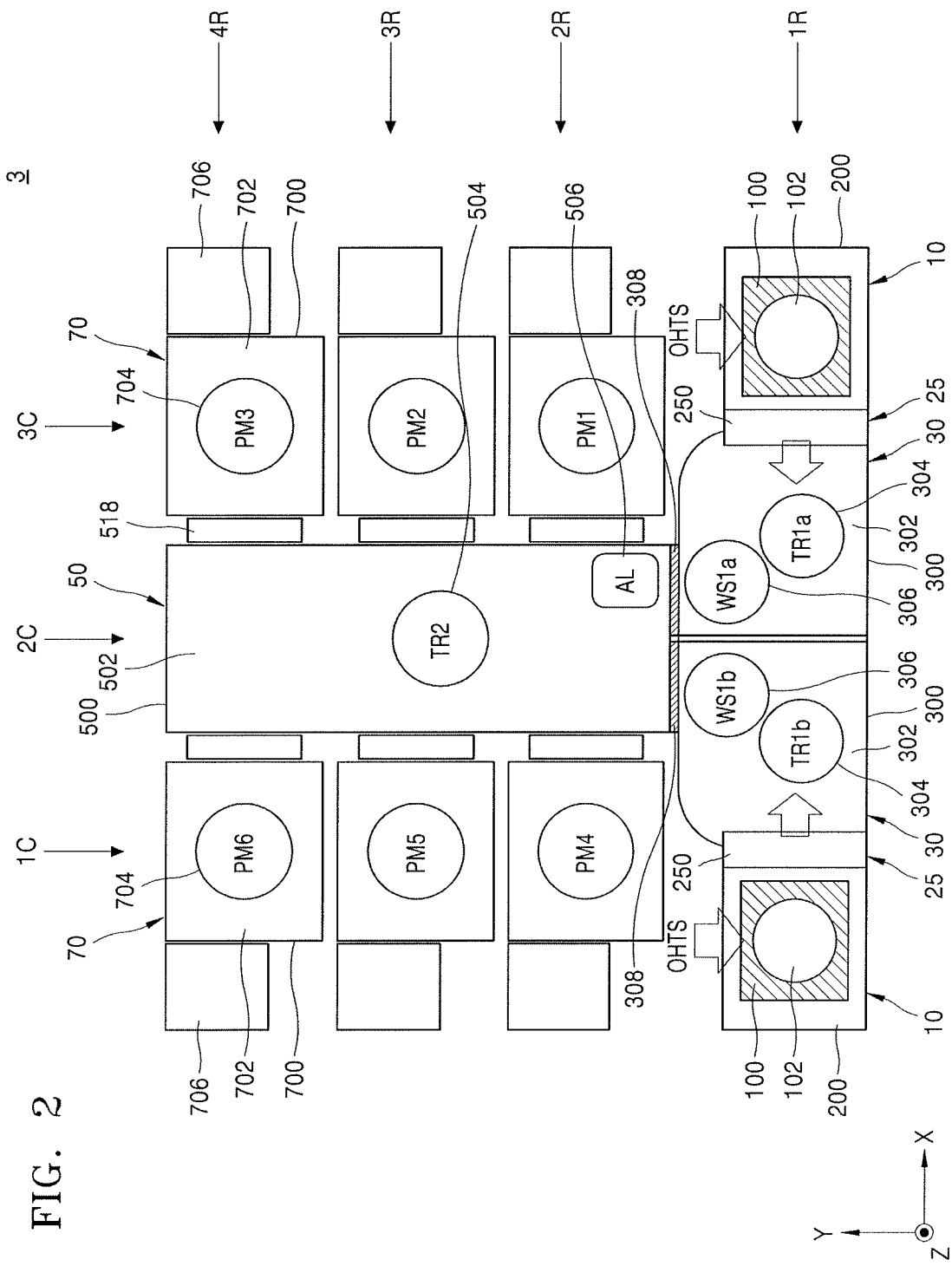
FIG. 2 illustrates a schematic diagram of a semiconductor manufacturing apparatus according to an embodiment.

FIG. 2 illustrates a schematic layout diagram of a semiconductor manufacturing apparatus 3 according to an embodiment.

For example, the semiconductor manufacturing apparatus 3 of FIG. 2 may be the same as the semiconductor manufacturing apparatus 1 of FIG. 1 except that an isolation module 25 may be further included between the load module 10 and the loadlock module 30. The isolation module 25 may be referred to as, e.g., a separation module, a separation unit, an isolation unit, or the like. The same reference numerals in FIGS. 1 and 2 denote the same elements. A repeated description of FIG. 2 which is the same as that of FIG. 1 may be given briefly or omitted herein.

The semiconductor manufacturing apparatus 3 may include the load module 10, the isolation module 25, the loadlock module 30, the transfer module 50, and the process module 70. The isolation module 25 may include an isolation chamber 250 that is located on one side of the load module 10 and connected directly to the substrate container 100. The isolation chamber 250 may be connected to the loadlock chamber 300 of the loadlock module 30.

The isolation chamber 250 may be located between the substrate container 100 and the loadlock chamber 300. The isolation chamber 250 may be located between the substrate container 100 and the loadlock chamber 300 and may seal the substrate container 100 and the loadlock chamber 300. The isolation chamber 250 may help prevent contamination of the substrates 102 by preventing the loadlock chamber 300 (within the semiconductor manufacturing factory) from being exposed to ambient air. As will be described below, the isolation chamber 250 may help prevent contamination of the substrates 102 by supplying a purge gas during a semiconductor device manufacturing process.

Figure 3:
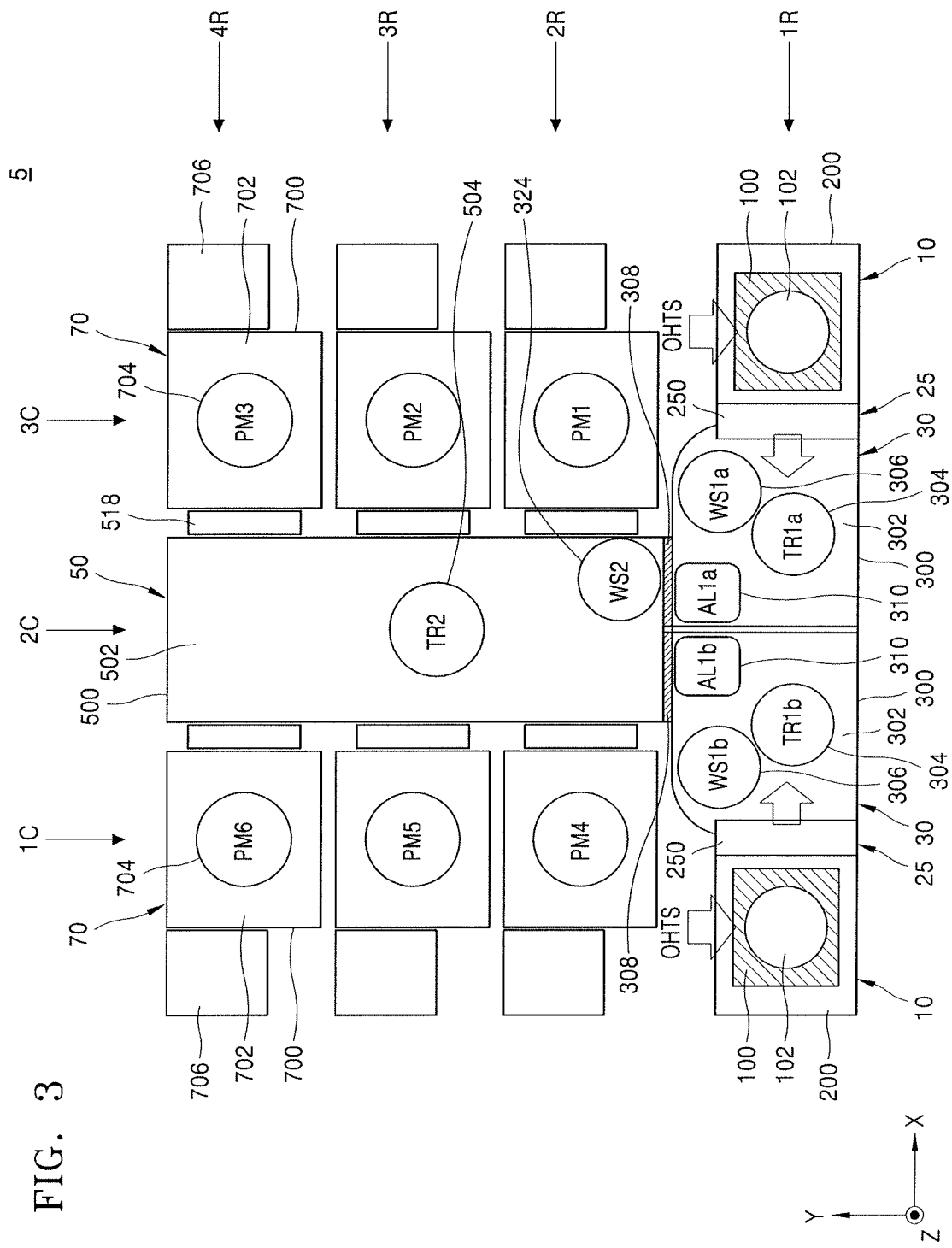
FIG. 3 illustrates a schematic diagram of a semiconductor manufacturing apparatus according to an embodiment.

FIG. 3 illustrates a schematic layout diagram of a semiconductor manufacturing apparatus 5 according to an embodiment.

For example, the semiconductor manufacturing apparatus 5 of FIG. 3 may be the same as the semiconductor manufacturing apparatuses 1 and 3 of FIGS. 1 and 2 except that a second substrate aligner 310 (AL1a, AL1b) may be included in the loadlock chamber 300 and a second substrate stage 324 (WS2) may be further included in the transfer chamber 500. The same reference numerals in FIG. 3 as those in FIGS. 1 and 2 indicate the same elements. Repeated descriptions of FIG. 3 identical to those given above with reference to FIGS. 1 and 2 may be omitted or briefly given below.

The semiconductor manufacturing apparatus 3 may include the load module 10, the isolation module 25, the loadlock module 30, the transfer module 50, and the process module 70. In an implementation, the second substrate aligner 310 (AL1a, AL1b) may be located in the loadlock chamber 300 of the loadlock module 30.

The second substrate aligner 310 may align a location or direction of a substrate 102 before the substrate 102 is transferred to the transfer chamber 500. In an implementation, the second substrate aligner 310 may align a location or direction of the substrate 102 before the substrate 102 is transferred from the loadlock chamber 300 to the substrate container 100.

The second substrate stage 324 may be provided within the transfer chamber 500. The second substrate stage 324 may be located or arranged before a substrate 102 is transferred to the process chamber 700 or before the substrate 102 is transferred to the loadlock chamber 300.

The above-described semiconductor manufacturing apparatus 5 may reliably transfer the substrates 102 from the load module 10 to the process module 70 or from the process module 70 to the load module 10 in various ways.

Figure 4:
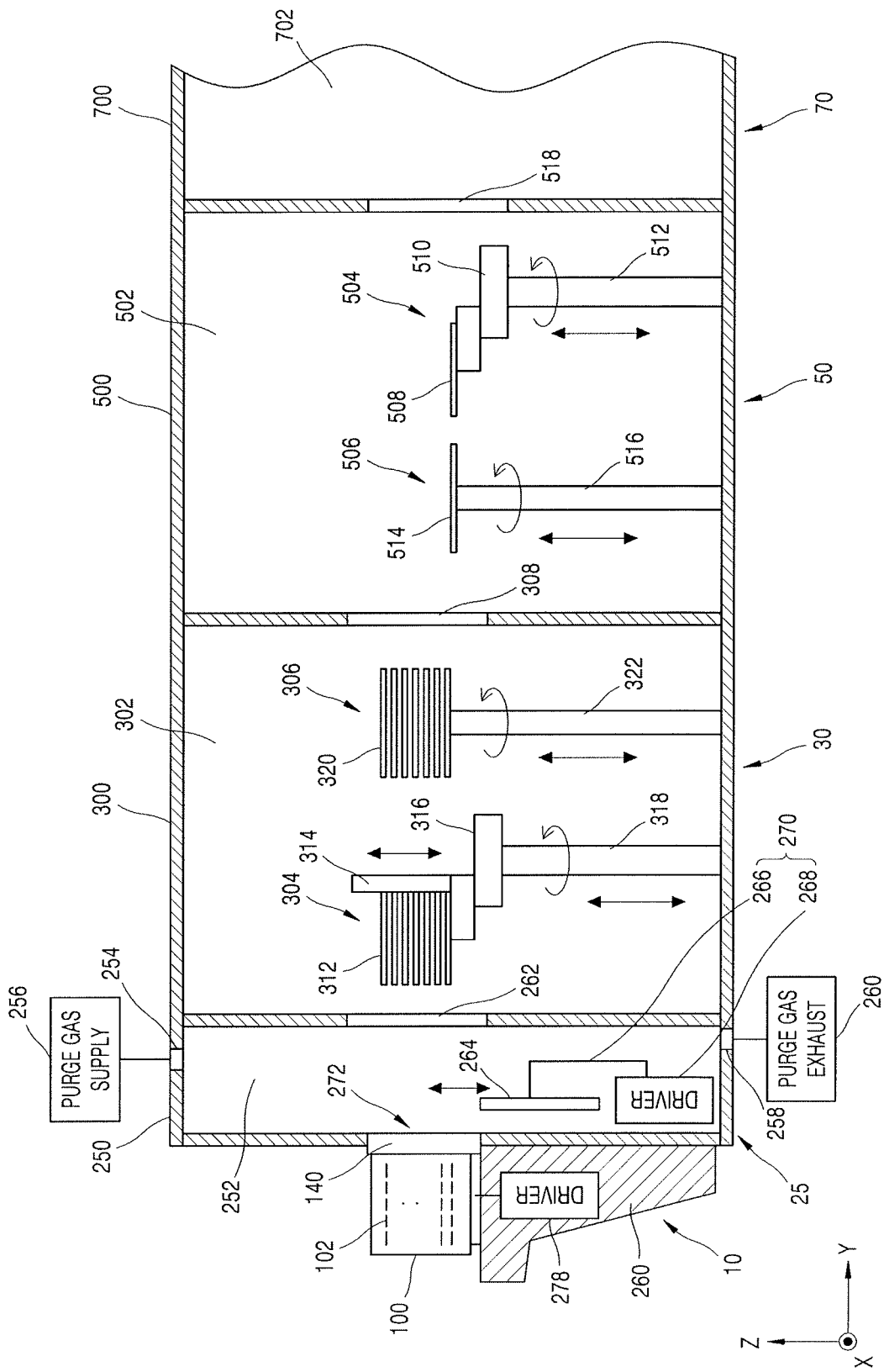
FIG. 4 illustrates a cross-sectional view of a semiconductor manufacturing apparatus according to an embodiment.

FIG. 4 illustrates a cross-sectional view of a semiconductor manufacturing apparatus according to an embodiment.

For example, FIG. 4 illustrates a cross-sectional view of the semiconductor manufacturing apparatus 3 of FIG. 2 including the isolation module 25. The semiconductor manufacturing apparatus 3 may include the load module 10 on its one side. The substrate container 100 may be located on the load port 200 included in the load module 10.

A plurality of substrates 102 may be mounted in the substrate container 100. The substrate container 100 includes the door 140, and contamination of the substrates 102 when the substrate container 100 is transferred by the substrate container transfer system (OHTS) may be prevented as described above.

The substrate container 100 on the load port 200 may be connected to a driving unit or driver 278. For example, the substrate container 100 may move in the Y direction to be close to the isolation chamber 250. The substrate container 100 may rotate such that the door 140 may face the isolation chamber 250.

The isolation module 25 including the isolation chamber 250 may be located on one side of the load module 10. The isolation chamber 250 may include an inner space 252. In the isolation chamber 250, a door locking device or door controller (264 and 270) capable of opening and closing the door 140 of the substrate container 100 may be provided. The door controller (264 and 270) may include a door holder 264 and a driving member 270 connected to the door holder 264.

The door holder 264 may be attached to the door 140 of the substrate container 100 and may open and close the door 140. The door holder 264 may move upwards, e.g., in a Z direction. The driving member 270 may include an arm 266 connected to the door holder 264, and a driving unit or driver 268, e.g., a driving motor.

The isolation chamber 250 may include an inflow and outflow hole 272 facing the door 140 of the substrate container 100, and may include an inflow and outflow door 262 opposite the inflow and outflow hole 272 in the direction of the loadlock chamber 300 or Y direction. A purge gas supply unit or purge gas supply 256 supplying a purge gas, e.g., a nitrogen gas, to the inner space 252 of the isolation chamber 250, and a purge gas exhaust unit or purge gas exhaust 260 (exhausting the purge gas supplied to the inner space 252 of the isolation chamber 250) may be provided on the isolation module 25.

The purge gas supply 256 and the purge gas exhaust 260 may supply and exhaust, respectively, the purge gas via a gas supply hole 254 and a gas exhaust hole 258, respectively, provided in a top and a bottom of the isolation chamber 250, respectively. The isolation chamber 250 may be supplied with a purge gas, thereby preventing contamination of the substrates 102 during a semiconductor device manufacturing process.

The loadlock module 30 may be on one side of the isolation module 25. The loadlock module 30 may include the loadlock chamber 300. The inflow and outflow door 262 in the isolation chamber 250 may block the inner space 302 of the loadlock chamber 300 from outside (e.g., from an exterior of the apparatus).

In the loadlock chamber 300, the first transfer robot 304 and the substrate stage 306 may be located in the inner space 302. The first transfer robot 304 may include a plurality of robot hands 312, a support 314, a robot arm 316, and a rotation shaft 318. The first transfer robot 304 may move in a vertical direction, e.g., the Z direction, or in a rotation direction, e.g., the X direction or Y direction.

The substrate stage 306 (on which the plurality of substrates 102 may be mounted) may be in the loadlock chamber 300. The substrate stage 306 may include a substrate station 320 and a rotation shaft 322. The substrate stage 306 may move in a vertical or Z direction, or in a rotation direction, e.g., the X direction or Y direction.

By including the plurality of robot hands 312, the first transfer robot 304 may transfer the plurality of substrates 102 included in the substrate container 100 to the substrate stage 306 of the loadlock chamber 300 via the isolation chamber 250. In an implementation, by including the plurality of robot hands 312, the first transfer robot 304 may transfer the plurality of substrates 102 included in the substrate stage 306 to the substrate container 100 via the isolation chamber 250.

The transfer module 50 may be on one side of the loadlock module 30. The inflow and outflow door 308 (restricting or controlling entry and exit of substrates by opening and closing a passage) may be between the loadlock module 30 and the transfer module 50. The substrate aligner 506 may be in the inner space 502 of the transfer chamber 500 of the transfer module 50. The substrate aligner 506 may include a rotation shaft 516 and a substrate station 514. The substrate aligner 506 may move in a vertical direction, e.g., the Z direction, or in a rotation direction, e.g., the X direction or Y direction.

The second transfer robot 504 may be in the inner space 502 of the transfer chamber 500. The second transfer robot 504 may include a single robot hand 508, a robot arm 510, and a rotation shaft 512. The second transfer robot 504 may move in a vertical direction, e.g., the Z direction, or in a rotation direction, e.g., the X direction or Y direction. When the inflow and outflow door 308 between the transfer module 50 and the loadlock module 30 has been opened, the second transfer robot 504 may carry a substrate 102 out of the substrate stage 306 or may carry a substrate 102 into the substrate stage 306.

The process module 70 may be on one side of the transfer module 50. The process module 70 may include the process chamber 700. The inflow and outflow door 518 (restricting or controlling entry and exit of substrates by opening and closing a passage) may be between the transfer chamber 500 and the process chamber 700. The substrate 102 moved in via the inflow and outflow door 518 may be subjected to the semiconductor manufacturing process in the inner space 702 of the process chamber 700.

Figure 5A:
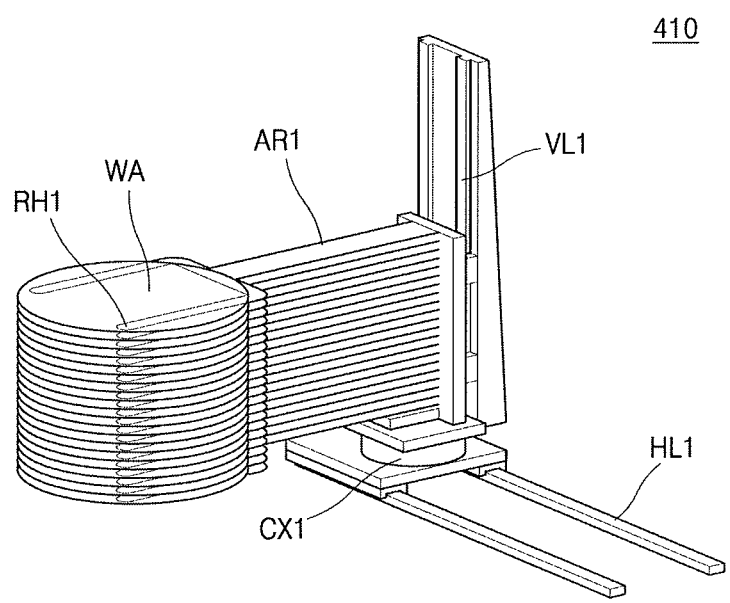
FIGS. 5A through 5C illustrate views of transfer robots of a semiconductor manufacturing apparatus according to an embodiment.
Figure 5B:
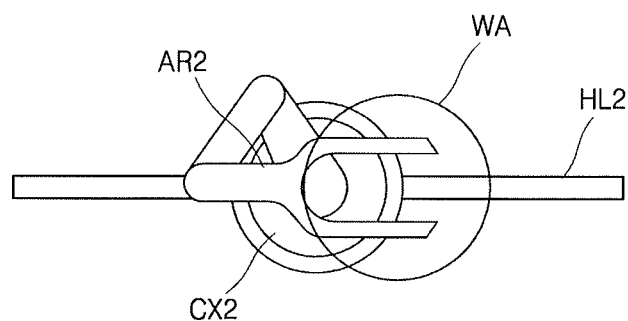
Figure 5C:
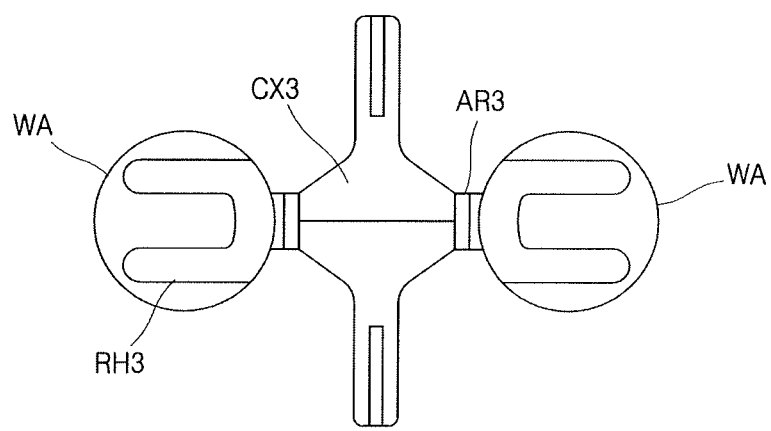

FIGS. 5A through 5C illustrate transfer robots of a semiconductor manufacturing apparatus according to an embodiment.

In an implementation, a transfer robot 410 of FIG. 5A may be used as the first transfer robot 304 of the semiconductor manufacturing apparatuses 1, 3, and 5 of FIGS. 1, 2, and 3. The transfer robot 410 may include a robot hand RH1 on which a substrate WA is located, a rotation shaft CX1, a horizontal rail HL1, a vertical rail VL1, and a robot arm AR1. The rotation shaft CX1 may be referred to as a support shaft.

A plurality of robot hands RH1 may be included to transfer a plurality of substrates WA. The substrate WA may correspond to the substrate 102 of FIGS. 1 through 3. The rotation shaft CX1 may be connected to the robot arm AR1 and may be located on and connected onto the horizontal rail HL1 and the vertical rail VL1. For example, the transfer robot 410 may move forwards and backwards (or leftwards and rightwards) along the horizontal rail HL1 and may move upwards and downwards along the vertical rail VL1. The transfer robot 410 may rotate as the rotation shaft CX1 rotates.

In an implementation, a transfer robot 420 of FIG. 5B may be used as the second transfer robot 504 of the semiconductor manufacturing apparatuses 1, 3, and 5 of FIGS. 1, 2, and 3. The transfer robot 420 may include a robot hand RH2 on which a substrate WA is located, a rotation shaft CX2, a horizontal rail HL2, and a robot arm AR2. The rotation shaft CX2 may be referred to as a support shaft.

A single robot hand RH2 may be included to transfer a single substrate WA. The substrate WA may correspond to the substrate 102 of FIGS. 1 through 3. The rotation shaft CX2 may be connected to the robot arm AR2 and may be located on and connected onto the horizontal rail HL2. For example, the transfer robot 420 may move leftwards and rightwards (or forwards and backwards) along the horizontal rail HL2. The transfer robot 420 may rotate as the rotation shaft CX2 rotates. When the rotation shaft CX2 rotates in a vertical direction, the transfer robot 420 may rotate in a vertical direction.

In an implementation, a transfer robot 430 of FIG. 5C may be used as the second transfer robot 504 of the semiconductor manufacturing apparatuses 1, 3, and 5 of FIGS. 1, 2, and 3. The transfer robot 430 may include a robot hand RH3 on which a substrate WA is located, a rotation shaft CX3, and a robot arm AR3. The rotation shaft CX3 may be referred to as a support shaft.

Two robot hands RH3 may be included to transfer two substrates WA. The substrate WA may correspond to the substrate 102 of FIGS. 1 through 3. The rotation shaft CX3 may be connected to the robot arm AR3. Accordingly, the transfer robot 430 may move leftwards and rightwards (or forwards and backwards) when the robot arm AR3 extends leftwards and rightwards. The transfer robot 430 may rotate as the rotation shaft CX3 rotates. When the rotation shaft CX3 rotates in a vertical direction, the transfer robot 430 may rotate in a vertical direction.

Figure 6:
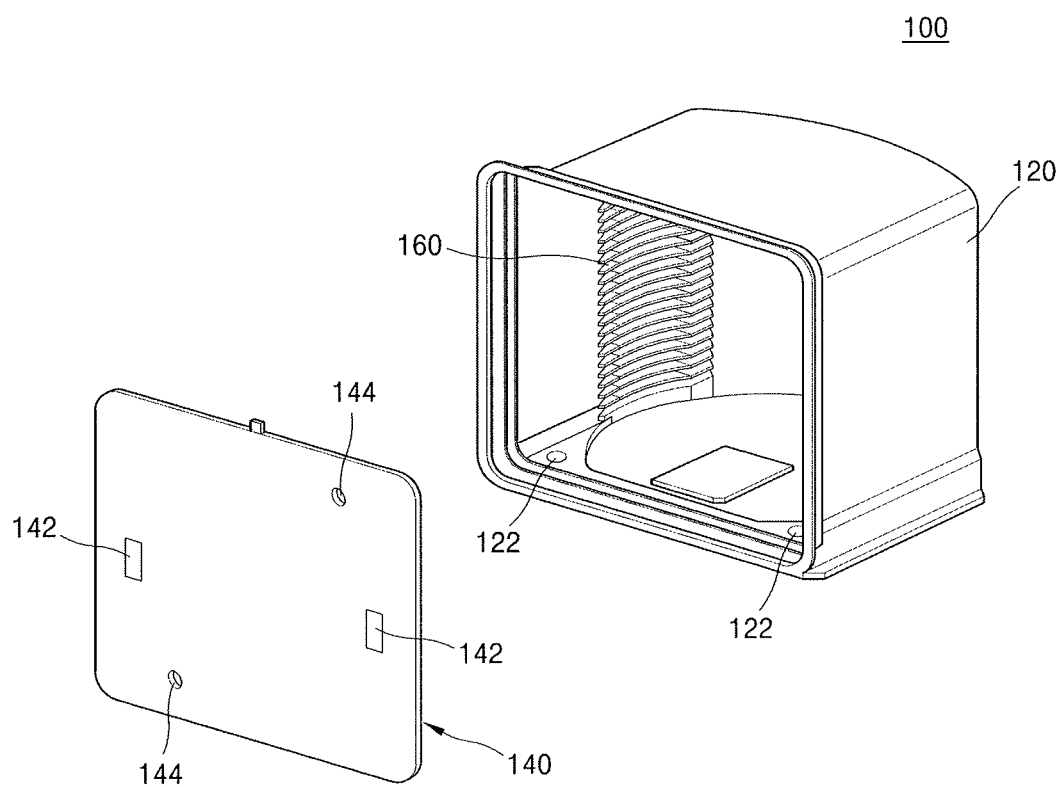
FIG. 6 illustrates a perspective view of a substrate container of a semiconductor manufacturing apparatus according to an embodiment.

FIG. 6 illustrates a perspective view of a substrate container of a semiconductor manufacturing apparatus according to an embodiment.

For example, the substrate container 100 may be an enclosed-type FOUP as described above. The substrate container 100 may have the body 120 of which a front side is open, and the door 140 opening and closing the front side of the body 120. Slots 160 (into which substrates 102 are insertable) may be on an inner sidewall of the body 120 to be parallel to each other and at the same time perpendicular to the door 140.

Gas supply holes 122 may be on the bottom of the substrate container 100. A purge gas supply capable of supplying a purge gas into the substrate container 100 may be connected to the gas supply holes 122. When the substrate container 100 is supplied with a purge gas, contamination of the substrates 102 of FIGS. 1 through 3 during a semiconductor device manufacturing process may be prevented.

Latch key holes 142 and registration pin holes 144 may be in the door 140. The latch key holes 142 and the registration pin holes 144 may open or close the door 140 by using the door holder 264 of FIGS. 1 through 3 and 7.

Figure 7:
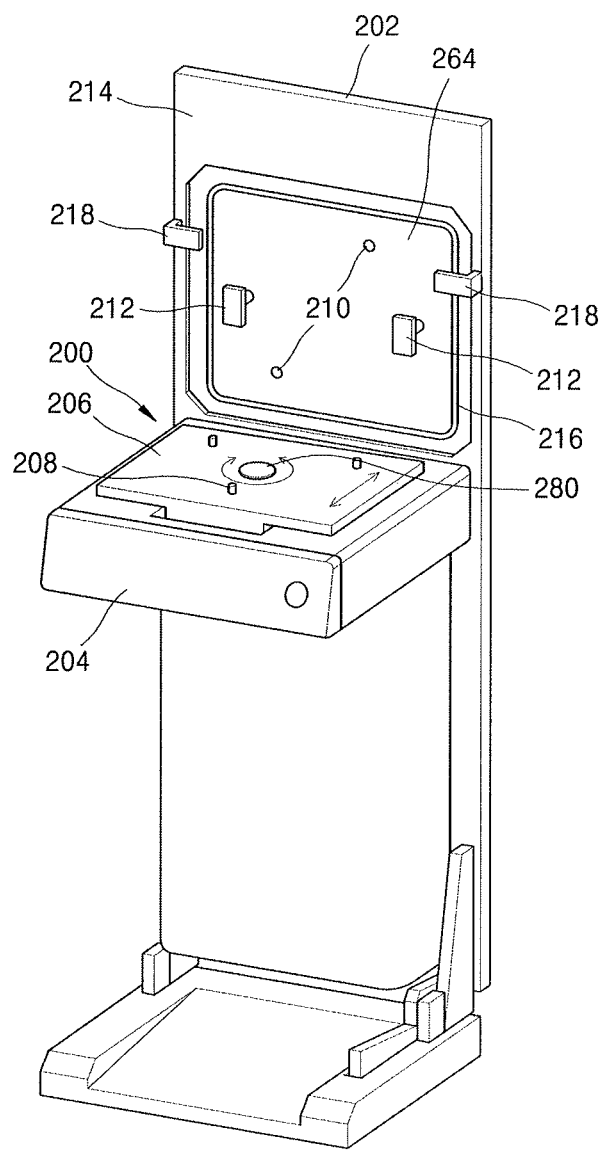
FIG. 7 illustrates a load port, a door holder, and an isolation chamber of a semiconductor manufacturing apparatus according to an embodiment.

FIG. 7 illustrates a combinational relationship between a load port, a door holder, and an isolation chamber of a semiconductor manufacturing apparatus according to an embodiment.

For example, in the load port 200, a load station 206 (on which the substrate container 100 of FIGS. 1 through 3 and 6 is placed) may be located on a support member 204. For convenience of explanation, no substrate containers are illustrated in FIG. 7. Protruding pins 208 may be provided on the load station 206.

The protruding pins 208 may be inserted into grooves on a bottom surface of the substrate container 100 when the substrate container 100 is placed on the load station 206. The substrate container 100 may be placed at an accurate location on the load station 206. The load station 206 may move in a back and forth direction, and accordingly, the substrate container 100 mounted on the load station 206 may also move in a back and forth direction.

In an implementation, a rotation shaft 280 connected to the driver 278 of FIG. 4 may be provided in the load station 206. For example, the substrate container 100 located on the load station 206 may be rotated, such that the door 140 of the substrate container 100 may be placed to face the door holder 264.

The door holder 264 may be provided on the load port 200 and a vertical frame 202 of the isolation chamber 250 of FIGS. 2 and 3. Registration pins 210 and latch keys 212 may be provided on the door holder 264. The registration pins 210 may allow the door 140 of the substrate container 100 to be coupled to an accurate location of the door holder 264. The latch keys 212 may be used to open the door 140 of the substrate container 100.

As described above with reference to FIG. 6, the registration pin holes 144 (into which the registration pins 210 are inserted), and the latch key holes 142 (into which the latch keys 212 are inserted) may be formed in the door 140. When the substrate container 100 loaded on the load station 206 is moved toward the door holder 264 of the vertical frame 202, the registration pins 210 are inserted into the registration pin holes 144, and a docking location of the door 140 and the door holder 264 may be determined.

When the latch keys 212 are inserted into the latch key holes 142 and are rotated, the door 140 may be coupled to the door holder 264. An O-ring 216 (capable of adhering or coupling the substrate container 100 to the isolation chamber 250 of FIGS. 2 through 4) may be provided on one sidewall 214 of the load port 200 and one sidewall 214 of the isolation chamber 250 of FIGS. 2 through 4. Clamps 218 (capable of adhering or coupling and fixing the substrate container 100 to the isolation chamber 250 of FIGS. 2 through 4) may be provided on the one sidewall 214 of the load port 200 and the one sidewall 214 of the isolation chamber 250 of FIGS. 2 through 4.

The arm 266 of FIG. 4 of the door controller (264 and 270) of FIG. 4 may be fixed and coupled to one surface of the door holder 264, and may be moved in a vertical direction and in a back and forth direction by the driver 268 of FIG. 4 on the support member 204. When the door 140 of the substrate container 100 is opened, the arm 266 makes the door holder 264 move backwards by a certain distance and then descend, thereby separating the door 140 from the body 120 of FIG. 6 of the substrate container 100.

When a substrate 102 is carried into the substrate container 100 by the second transfer robot 504 of FIGS. 1 through 4 and the first transfer robot 304 of FIGS. 1 through 4 after a semiconductor manufacturing process is performed, the door holder 264 may ascend and then move forwards, and the door 140 may be coupled to the body 120 of the substrate container 100.

Figure 8:
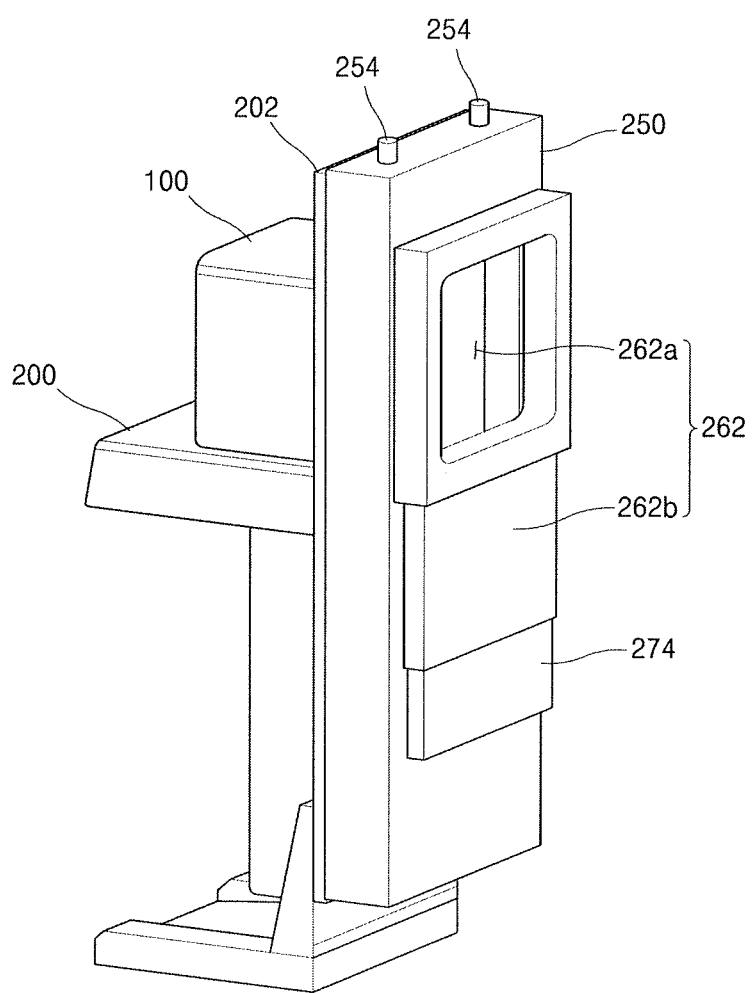
FIG. 8 illustrates a combinational relationship between a substrate container on a load port and an isolation chamber of a semiconductor manufacturing apparatus according to an embodiment.

FIG. 8 illustrates a combinational relationship between a substrate container on a load port and an isolation chamber of a semiconductor manufacturing apparatus according to an embodiment.

For example, the substrate container 100 of the semiconductor manufacturing apparatus may be located on the load port 200. The substrate container 100 may couple to the load port 200 and the vertical frame 202 of the isolation chamber 250 of FIGS. 2 and 3. The substrate container 100 and the isolation chamber 250 may be coupled to each other by the O-ring 216 of FIG. 7 and the clamps 218 of FIG. 7. The isolation chamber 250 may include, on one side, the inflow and outflow door 262 through which the substrates 102 may enter and exit. The inflow and outflow door 262 may include a gate 262a and a door 262b opening and closing the gate 262a. The inflow and outflow door 262 may be connected to a door opening and closing member 274.

When the substrate container 100 and the isolation chamber 250 couple to each other, contamination of substrates by ambient air during a semiconductor device manufacturing process may be prevented. In addition, gas supply holes 254 for supplying a purge gas may be provided on the isolation chamber 250. For example, contamination of the substrates 102 during the semiconductor device manufacturing process may be prevented.

Figure 9:
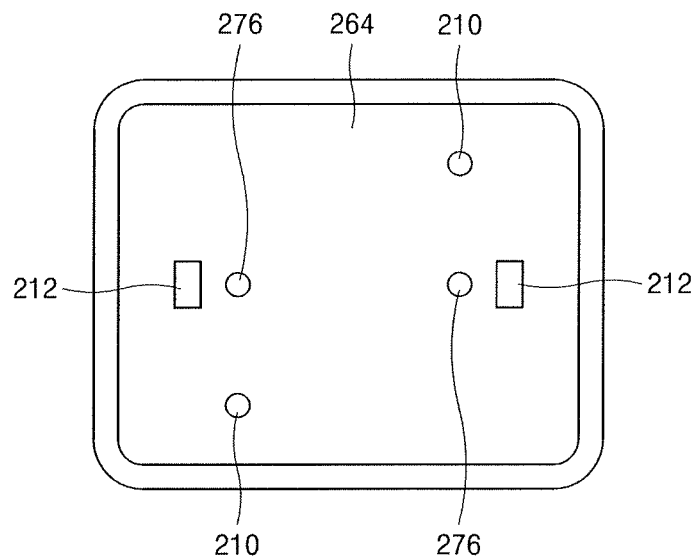
FIG. 9 illustrates a door holder of a semiconductor manufacturing apparatus according to an embodiment.

FIG. 9 illustrates a door holder of a semiconductor manufacturing apparatus according to an embodiment.

For example, as described above, the registration pins 210 and the latch keys 212 may be provided on the door holder 264. Furthermore, in FIG. 9, door fixers 276 may be provided on the door holder 264.

The door fixers 276 may help prevent the door 140 of the substrate container 100 from shaking even while a purge gas is being injected into the substrate container 100 of FIGS. 1 through 4 and 6. For example, the door fixers 276 may fix the door 140 to the door holder 264.

The door fixers 276 may include one vacuum hole or a plurality of vacuum holes in the door holder 264. A vacuum pump may be coupled to the door fixers 276.

Figure 10:
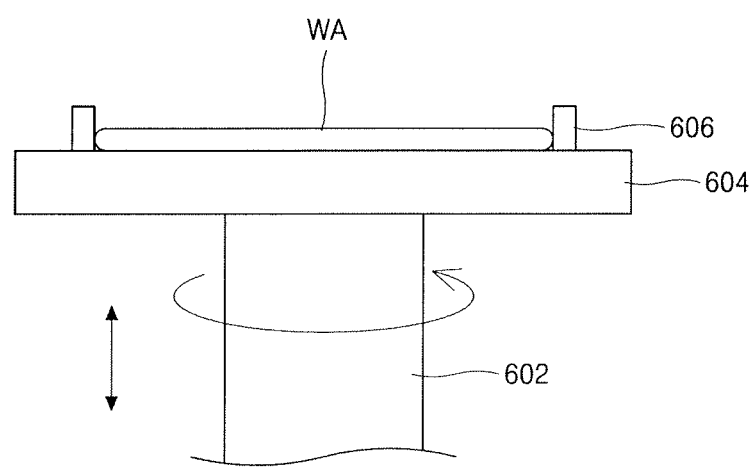
FIG. 10 illustrates a substrate aligner of a semiconductor manufacturing apparatus according to an embodiment.

FIG. 10 illustrates a substrate aligner of a semiconductor manufacturing apparatus according to an embodiment.

For example, the substrate aligner of FIG. 10 may be used as the substrate aligners 506 and 310 of FIGS. 1 through 4. The substrate aligner of FIG. 10 may include a substrate chuck (604 and 606) fixing a substrate WA, and a rotation shaft 602 capable of rotating the substrate chuck (604 and 606). The substrate WA may correspond to the substrate 102 of FIGS. 1 through 4.

The substrate chuck (604 and 606) may mechanically fix the substrate WA. The substrate chuck (604 and 606) may include a base 604 on which the substrate WA is seated, and a substrate clamp 606 for supporting the substrate WA seated on the base 604.

For example, a process of aligning the substrate WA by using the substrate aligner will now be described. First, the substrate WA is transferred to the base 604 by a transfer robot. When the substrate WA is seated on the base 604 by the transfer robot, the substrate clamp 606 may contact and support the substrate WA. When the substrate WA is fixed by the substrate clamp 606, a substrate alignment device may detect a crystal orientation of the substrate WA, and may rotate the substrate chuck (604 and 606) such that the detected crystal orientation is in a preset direction. When alignment of the substrate WA is completed, the substrate clamp 606 may release fixing of the substrate WA.

Figure 11:
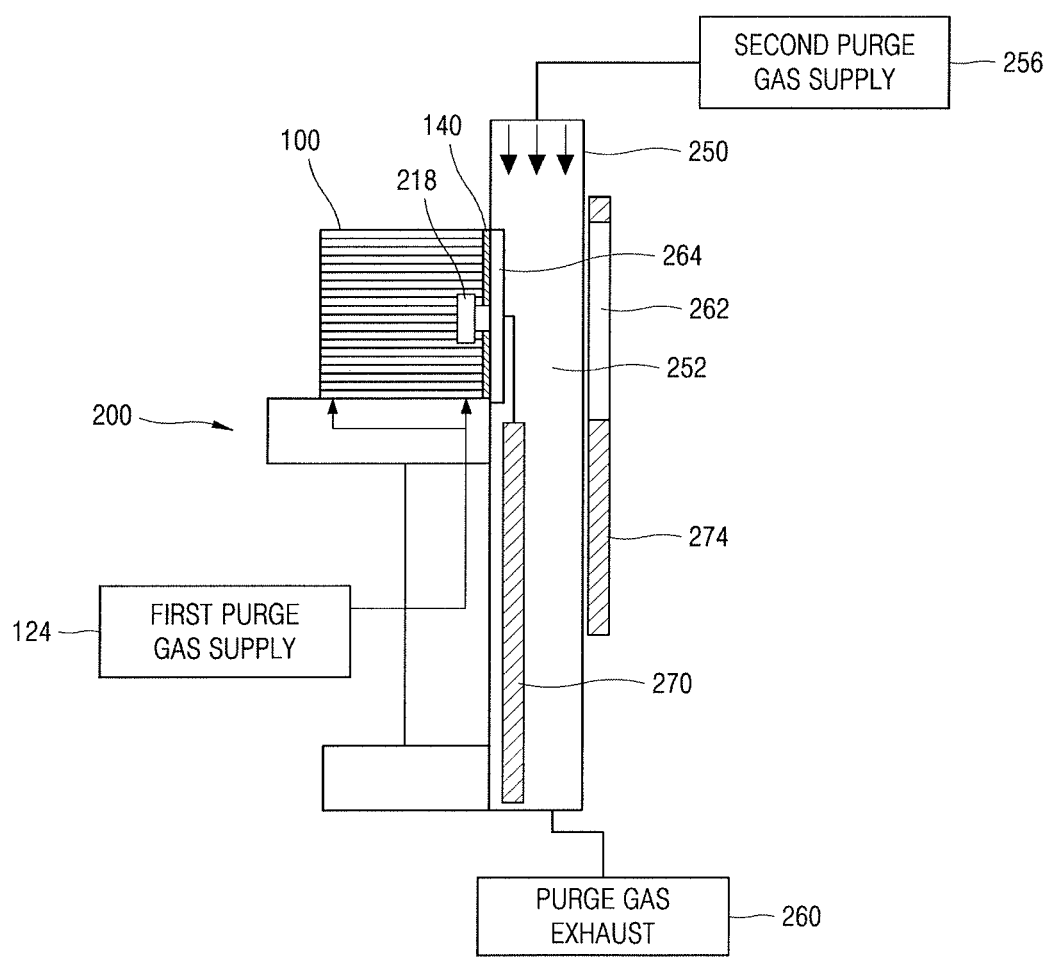
FIG. 11 illustrates a cross-sectional view of a combinational relationship between a substrate container and an isolation chamber and supply of a purge gas in a semiconductor manufacturing apparatus according to an embodiment.

FIG. 11 illustrates a cross-sectional view of a combinational relationship between a substrate container and an isolation chamber and supply of a purge gas in a semiconductor manufacturing apparatus according to an embodiment.

For example, the substrate container 100 may be located on the load port 200. In FIG. 11, the door 140 is located in the substrate container 100. The substrate container 100 may be supplied with a purge gas by a first purge gas supply 124.

The substrate container 100 may adhere to or be coupled to the isolation chamber 250. The substrate container 100 and the isolation chamber 250 may be coupled to each other by the clamps 218 on one side of the isolation chamber 250. When the substrate container 100 and the isolation chamber 250 are coupled to each other, contamination of substrates by ambient air during a semiconductor device manufacturing process may be prevented.

The isolation chamber 250 may include the door holder 264 and the driving member 270 driving the door holder 264. The isolation chamber 250 may include, on one side, the inflow and outflow door 262 through which the substrates 102 may enter and exit. The inflow and outflow door 262 may be connected to the door opening and closing member 274.

A second purge gas supply 256 may be connected to the top of the isolation chamber 250. A purge gas may be supplied to the inner space 252 of the isolation chamber 250 via the second purge gas supply 256. The purge gas supplied to the inner space 252 of the isolation chamber 250 may be exhausted to the purge gas exhaust 260 located on the bottom of the isolation chamber 250.

For example, when the isolation chamber 250 is supplied with a purge gas, contamination of the substrates 102 of FIGS. 1 through 4 during a semiconductor device manufacturing process may be prevented. In FIG. 11, for convenience of explanation, the first purge gas supply 124 and the second purge gas supply 256 specify first and second orders, respectively.

Figure 12:
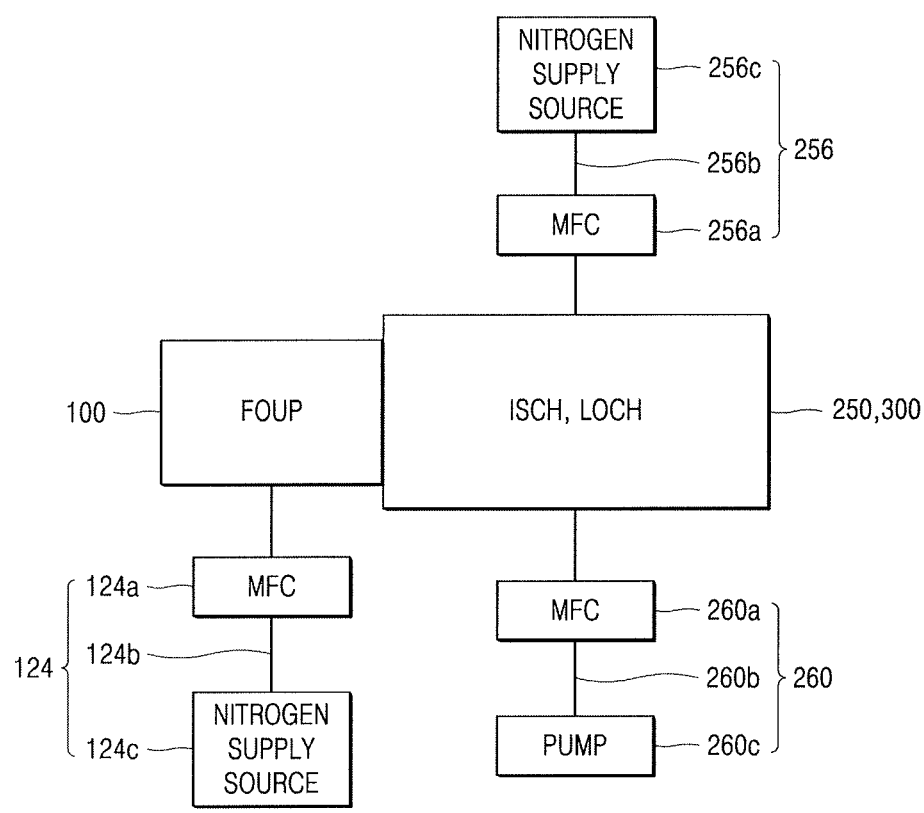
FIG. 12 illustrates a flow of a purge gas that is supplied to a substrate container, an isolation chamber, and a loadlock chamber of a semiconductor manufacturing apparatus according to an embodiment.

FIG. 12 illustrates a flow of a purge gas that is supplied to a substrate container, an isolation chamber, and a loadlock chamber of a semiconductor manufacturing apparatus according to an embodiment.

For example, in the semiconductor manufacturing apparatus, the isolation chamber 250 (ISCH) and the loadlock chamber 300 (LOCH) may be connected to the substrate container 100 (FOUP). The substrate container 100 may be supplied with a purge gas by the first purge gas supply 124. The first purge gas supply 124 may include a mass flow controller (MFC) 124a, a supply line 124b, and a nitrogen supply source 124c. The purge gas supplied to the substrate container 100 may be exhausted via the purge gas exhaust 260.

The second purge gas supply 256 may be connected to the isolation chamber 250 and the loadlock chamber 300. In an implementation, as illustrated in FIG. 12, the second purge gas supply 256 may be connected to the isolation chamber 250 and the loadlock chamber 300. In an implementation, the second purge gas supply 256 may be connected to only the isolation chamber 250. The second purge gas supply 256 may include an MFC 256a, a supply line 256b, and a nitrogen supply source 256c.

The purge gas exhaust 260 may be connected to the isolation chamber 250 and the loadlock chamber 300. In an implementation, as illustrated in FIG. 12, the purge gas exhaust 260 may be connected to the isolation chamber 250 and the loadlock chamber 300. In an implementation, the purge gas exhaust 260 may be connected to only the isolation chamber 250. The purge gas exhaust 260 may include an MFC 260a, a supply line 260b, and a pump 260c.

In an implementation, as illustrated in FIG. 12, a nitrogen gas is used as the purge gas. In an implementation, an inert gas, e.g., an argon gas, may be used. In FIG. 12, for convenience of explanation, the first purge gas supply 124 and the second purge gas supply 256 specify first and second orders, respectively.

One or more embodiments may provide a semiconductor manufacturing apparatus capable of reducing a footprint and also reducing substrate contamination.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor manufacturing apparatus, comprising:
    at least one load module including a load port on which a substrate container is located, a plurality of substrates being mountable on the substrate container;
    at least one loadlock module including:
        a loadlock chamber directly connected to the substrate container, the loadlock chamber interchangeably having atmospheric pressure and vacuum pressure,
        a first transfer robot within the loadlock chamber, and
        a substrate stage within the loadlock chamber, the plurality of substrates being mountable on the substrate stage;
    a transfer module including:
        a transfer chamber connected to the loadlock chamber,
        a second transfer robot within the transfer chamber, and
        a substrate aligner within the transfer chamber; and
    at least one process module including at least one process chamber connected to the transfer module,
    wherein:
    the at least one load module and the at least one loadlock module are aligned on a first row in a first direction in the semiconductor manufacturing apparatus,
    the at least one load module and the at least one loadlock module include a plurality of load modules and a plurality of loadlock modules, respectively,
    the transfer module and the at least one process module are aligned on a second row in the first direction in the semiconductor manufacturing apparatus, the second row being spaced apart from the first row in a second direction that crosses the first direction, and
    the at least one process module includes row process modules grouped in the first direction and column process modules grouped in the second direction.

2. The semiconductor manufacturing apparatus as claimed in claim 1, wherein the transfer module is between the column process modules in the first direction.

3. The semiconductor manufacturing apparatus as claimed in claim 1, wherein:
    the substrate container includes a gas supply hole, and
    a purge gas supply is connected to the gas supply hole to supply a purge gas into the substrate container.

4. The semiconductor manufacturing apparatus as claimed in claim 1, wherein the transfer chamber further includes a second substrate stage on which the plurality of substrates are mountable.

5. The semiconductor manufacturing apparatus as claimed in claim 1, wherein:
the at least one process module includes a plurality of process chambers, and
the at least one loadlock module corresponds to the plurality of process chambers.

6. The semiconductor manufacturing apparatus as claimed in claim 1, wherein:
the first transfer robot includes a plurality of robot hands configured to transfer the plurality of substrates, and
the second transfer robot includes a single robot hand configured to transfer a single substrate.

7. The semiconductor manufacturing apparatus as claimed in claim 1, wherein:
the loadlock chamber is isolatable from an ambient atmosphere outside of the semiconductor manufacturing apparatus, and
a purge gas supply is connected to the loadlock chamber to supply a purge gas.

8. A semiconductor manufacturing apparatus, comprising:
a load module including a load port on which a substrate container is located, a plurality of substrates being mountable on the substrate container;
an isolation module including an isolation chamber on one side of the load module and directly connected to the substrate container;
a loadlock module including:
a loadlock chamber connected to the isolation chamber,
a first transfer robot within the loadlock chamber, and
a substrate stage within the loadlock chamber, the plurality of substrates being mountable on the substrate stage;
a transfer module including:
a transfer chamber connected to the loadlock chamber, and
a second transfer robot within the transfer chamber; and
a process module including a process chamber connected to the transfer module.

9. The semiconductor manufacturing apparatus as claimed in claim 8, wherein the isolation module further includes a door controller within the isolation chamber, the door controller being configured to open or close a door of the substrate container.

10. The semiconductor manufacturing apparatus as claimed in claim 8, wherein the isolation chamber includes:
an inflow and outflow hole at one side facing a door of the substrate container, and
an inflow and outflow door on another side opposite to the one side and facing the loadlock chamber.

11. The semiconductor manufacturing apparatus as claimed in claim 8, wherein the isolation module further includes:
a purge gas supply configured to supply a purge gas into the isolation chamber, and
a purge gas exhaust configured to exhaust a purge gas from the isolation chamber.

12. The semiconductor manufacturing apparatus as claimed in claim 11, wherein:
the substrate container includes a gas supply hole therein,
the substrate container includes a second purge gas supply connected to the gas supply hole, the second purge gas supply being configured to supply a purge gas into the substrate container, and
the purge gas exhaust is configured to exhaust the purge gas from the substrate container.

13. The semiconductor manufacturing apparatus as claimed in claim 8, wherein the load port further includes a driver connected to the substrate container, the driver being configured to rotate the substrate container or to move the substrate container in a direction toward the isolation chamber.

14. The semiconductor manufacturing apparatus as claimed in claim 8, wherein one sidewall of the isolation chamber further includes an O-ring thereon, the O-ring being configured to couple the substrate container to the isolation chamber.

15. The semiconductor manufacturing apparatus as claimed in claim 8, wherein one sidewall of the isolation chamber further includes a clamp thereon, the clamp being configured to couple and fix the substrate container to the isolation chamber.

16. A semiconductor manufacturing apparatus, comprising:
a load module including a load port on which a substrate container is seated, the substrate container having a door on one side and being transferrable according to a substrate container transfer system, the load module being connected to a purge gas supply for supplying a purge gas into the substrate container;
an isolation module including an isolation chamber on one side of the load module, the isolation chamber including:
a substrate inflow and outflow hole facing a door of the substrate container,
a substrate inflow and outflow door on side opposite to a side on which the substrate inflow and outflow hole is provided, and
a door controller within the isolation chamber, the door controller being configured to open or close the door of the substrate container;
a loadlock module including:
a loadlock chamber connected to the isolation chamber,
a first transfer robot within the loadlock chamber, and
a substrate stage within the loadlock chamber, a plurality of substrates being mountable on the substrate stage;
a transfer module including:
a transfer chamber connected to the loadlock chamber, and
a second transfer robot within the transfer chamber; and
a process module including a process chamber connected to the transfer module.

17. The semiconductor manufacturing apparatus as claimed in claim 16, wherein at least one of the loadlock chamber and the transfer chamber further includes a substrate aligner therein.

18. The semiconductor manufacturing apparatus as claimed in claim 16, wherein:
the load module, the isolation module, and the loadlock module are aligned on a first row in a first direction in the semiconductor manufacturing apparatus, and
the transfer module and the process module are aligned on a second row in the first direction in the semiconductor manufacturing apparatus, the second row being spaced apart from the first row in a second direction that crosses the first direction.

* * * * *